United States Patent [19]

Teter

[11] Patent Number: 5,705,863
[45] Date of Patent: Jan. 6, 1998

[54] HIGH SPEED MAGNETOSTRICTIVE LINEAR MOTOR

[75] Inventor: Joseph P. Teter, Mt. Airy, Md.

[73] Assignee: The United States of America as represented by the Secretary of the Navy, Washington, D.C.

[21] Appl. No.: 433,857

[22] Filed: May 2, 1995

[51] Int. Cl.⁶ ............................................. H02N 2/00
[52] U.S. Cl. ........................................ 310/26; 318/118
[58] Field of Search ...................... 310/26, 20; 318/118; 335/215

[56] References Cited

U.S. PATENT DOCUMENTS

| | | | |
|---|---|---|---|
| 4,767,955 | 8/1988 | McDaniel | 310/20 |
| 4,835,425 | 5/1989 | LaSota | 310/14 |
| 5,424,622 | 6/1995 | Keller et al. | 318/375 |
| 5,452,153 | 9/1995 | Baheri et al. | 360/78.05 |

OTHER PUBLICATIONS

Fluid Injector by Anonymous Research Disclosure Aug. 1988 pp. 579–581.

Primary Examiner—Steven L. Stephan
Assistant Examiner—Judson H. Jones
Attorney, Agent, or Firm—John Forrest; Jacob Shuster

[57] ABSTRACT

A linear actuator having a magnetostrictive rod is magnetically energized under analog logic control in operative relation to a pair of electrically disengaged one-way locking devices, one of which is interconnected with the actuator through a stroke multiplier for high force, high speed motor drive. Two stage operation of the stroke multiplier is effected through levers angularly displaced by angular deformation of the magnetostrictive rod about a pivotal axis offset from the rod axis by means of a flexible support for such levers to avoid wear and backlash.

18 Claims, 4 Drawing Sheets

HIGH SPEED MAGNETOSTRICTIVE LINEAR MOTOR

BACKGROUND OF THE INVENTION

This invention relates in general to electric motors of the type having linear magnetodistortive actuators. Motors of the foregoing type are disclosed for example in U.S. Pat. Nos. 4,959,576, 5,039,894 and 5,041,753 to Ealey et al., Teter et al. and Clark et al., respectively. U.S. Pat. No. 4,767,955 to McDaniel is also of interest in disclosing a linear actuator type of electric motor having a stroke multiplier and stroke limiter associated therewith.

The magnetostrictive motor arrangements disclosed in the foregoing referred to patents translate small strokes obtained through high power magnetostrictive rod elements into linear motions. However, such motors are inherently slow and subject to malfunction inducing wear of the magnetostrictive rod elements. As to the McDaniel patent, the motor has a gear type stroke multiplier and does not have the advantages of magnetostrictive rod elements.

It is therefore an important object of the present invention to provide a magnetostrictive type of linear motor having a high speed operational capability with less wear under high force transmitting conditions.

SUMMARY OF THE INVENTION

In accordance with the present invention, a linear actuator has a magnetodistortive rod surrounded by an excitation coil to provide the necessary magnetic field opposed by the magnetic pre-bias of an outer surrounding permanent magnet in response to magnetostrictive contraction of the rod. A two-stage stroke multiplier is connected to the actuator in which there is no gearing. Instead the pivotal action of levers are relied upon to transform angular deformation of the actuator rod into axial deformation to multiply the linear stroke of the actuator. Such pivotal action is performed without pivot joints by use of flexible material to avoid wear and backlash. Multiplied linear motion is limited in both directions of travel by one-way braking actions of releasable roller lock devices connected to the actuator and the stroke multiplier. The lock devices are electrically disengaged under logic control for unidirectional motor drive.

BRIEF DESCRIPTION OF DRAWING FIGURES

A more complete appreciation of the invention and many of its attendant advantages will be readily appreciated as the same becomes better understood by reference to the following detailed description when considered in connection with the accompanying drawings wherein.

Figure 2:
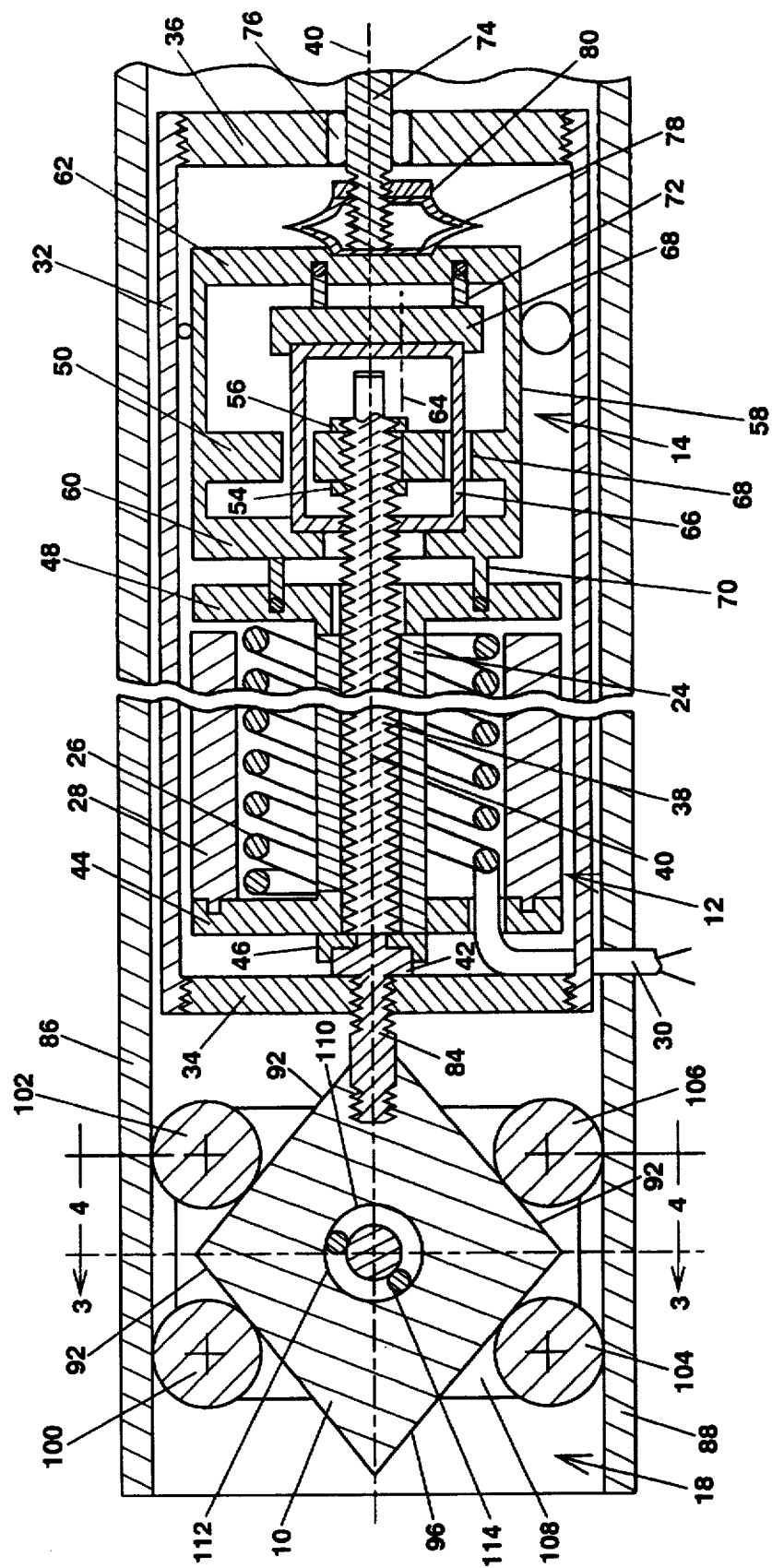
FIG. 2 is a partial side section view of a portion of the motor system depicted in FIG. 1, in accordance with one embodiment of the invention.
Figure 3:
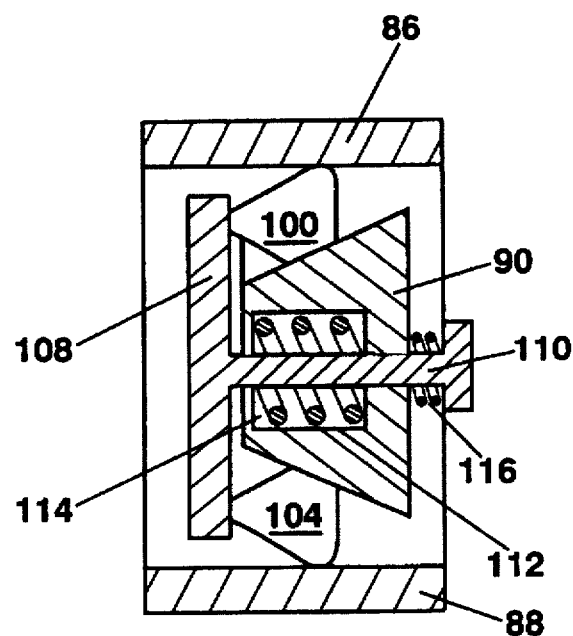
Figure 4:
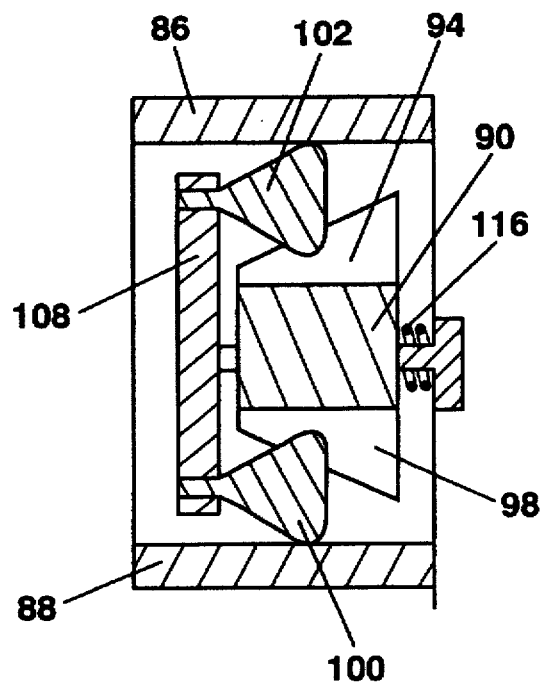
Figure 5:
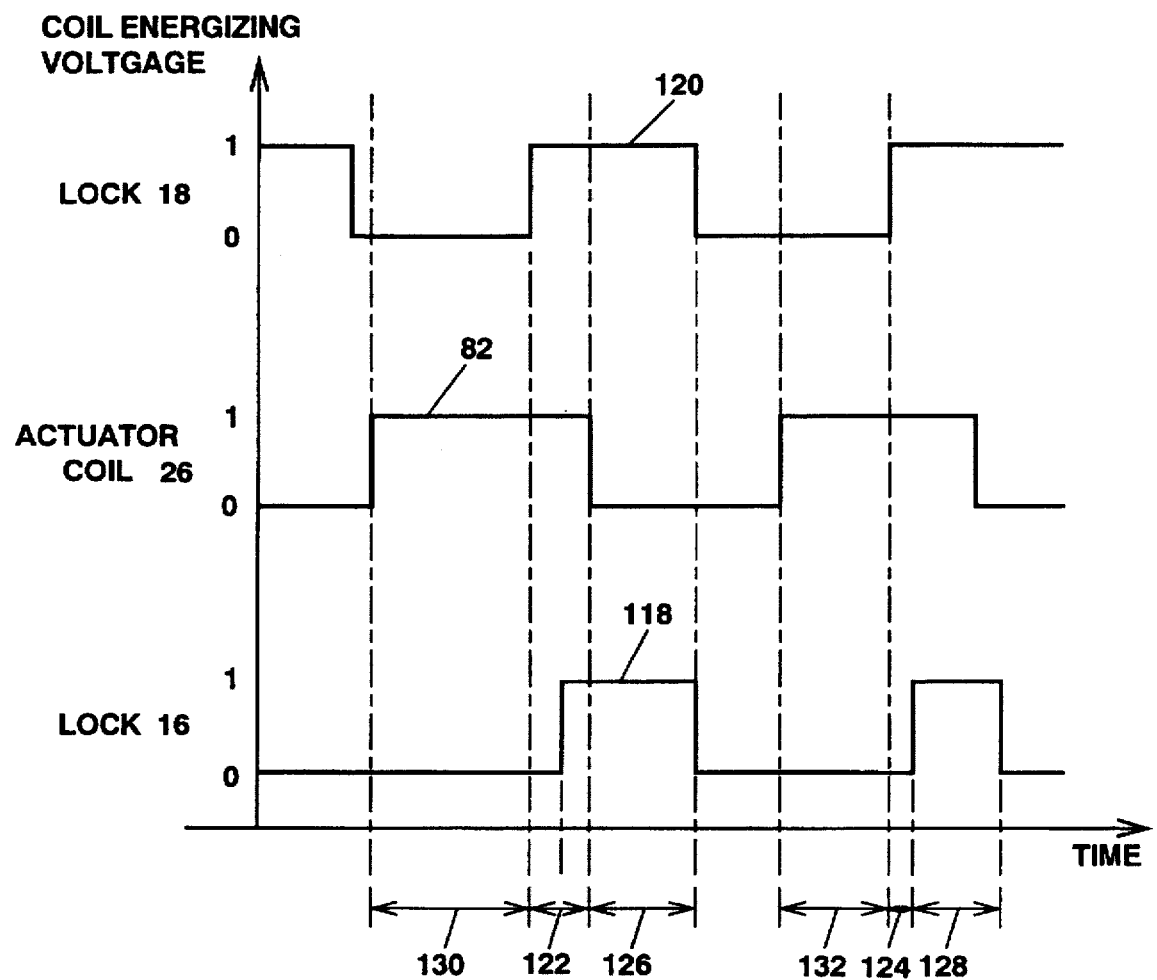

FIGS. 3 and 4 are transverse section views taken substantially through planes indicated by section lines 3—3 and 4—4 in FIG. 2; and FIG. 5 is a graph depicting certain operational characteristics of the motor system.

DETAILED DESCRIPTION OF PREFERRED EMBODIMENT

Figure 1:
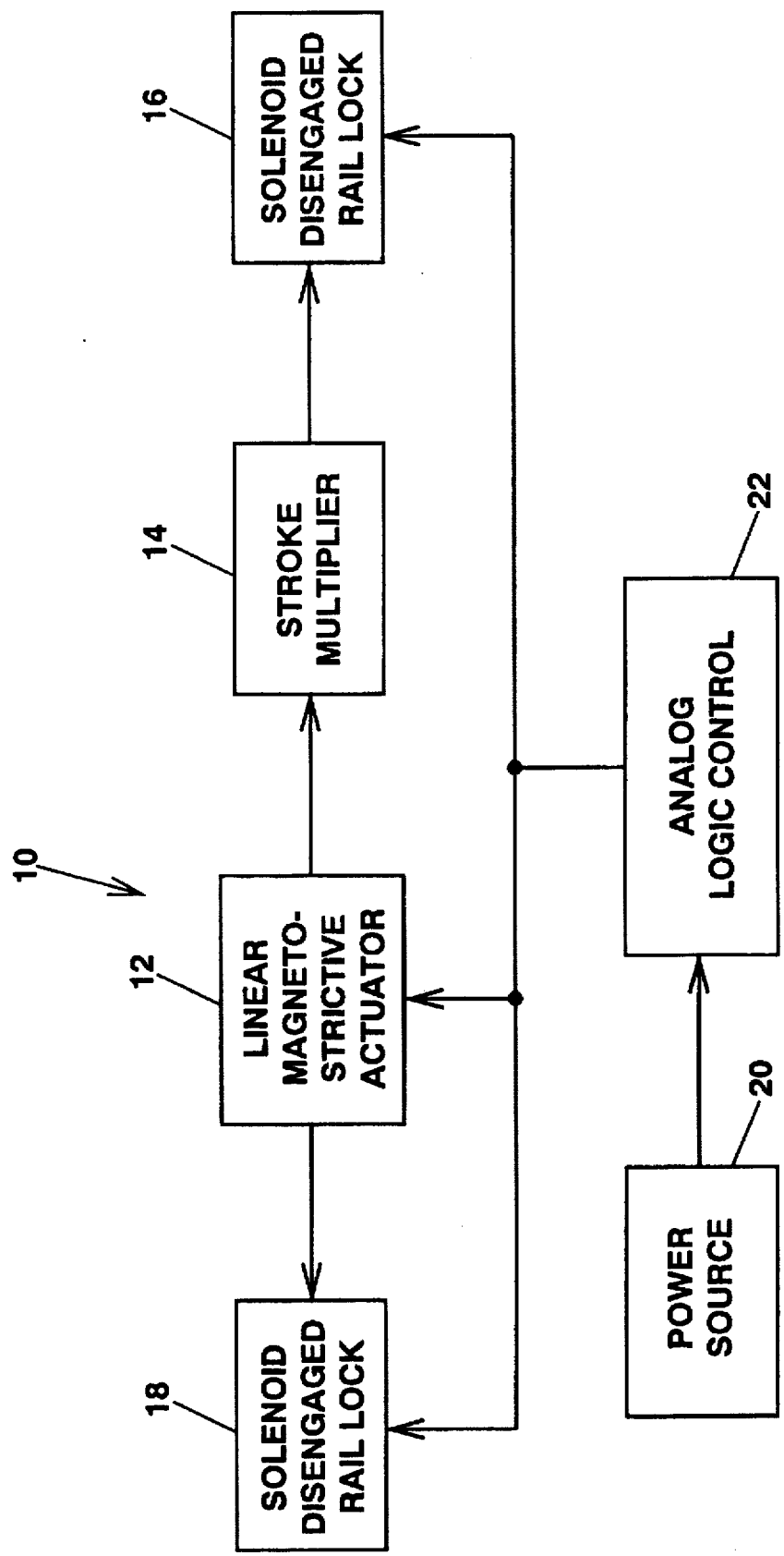
FIG. 1 is a block diagram of the motor system associated with the present invention.

Referring now to the drawing in detail, FIG. 1 diagrams a motor system of the present invention, generally referred to by reference numeral 10. The motor system 10 embodies as a basic component thereof a linear actuator 12 of a magnetostrictive type disclosed for example in U.S. Pat. No. 5,039,894 to Teter et al. Actuator 12 is connected at one axial end to a stroke multiplier 14 to which a solenoid disengaged lock assembly 16 is connected. A second solenoid disengaged lock assembly 18 is connected to one axial end of the actuator 12 opposite the stroke multiplier 14. All four of the foregoing components 12, 14, 16 and 18 of the motor system 10 are energized from an electrical power source 20 through an analog logic control component 22 as diagrammed in FIG. 1.

As shown in FIG. 2, the actuator 12 includes an active component including a Terfenol-D type of magnetodistortive rod 24 through which a stress bolt 38 extends in non-engaged relation thereto. The rod 24 is surrounded by an excitation coil 26 by means of which a magnetic field is established. The coil 26 and rod 24 are surrounded by a tubular-shaped permanent magnet 28. The tubular magnet 28 creates a hard magnetic pre-bias opposing the magnetic field established by energization of the coil 26 through a cable 30 extending from the aforementioned logic control 22. Accordingly, the magnetostrictive rod 24 is elongated in response to energization of coil 26 by a reduced amount, such as one-half of maximum axial elongation and is maintained in such axially elongated condition by the pre-bias of the permanent magnet 28 upon deenergization of the coil 26. The rod 24 is also axially contracted from such pre-biased condition during deenergization of coil 26.

Both the actuator 12 and the stroke multiplier 14 are enclosed within an outer shell 32, as shown in FIG. 2, made of a non-magnetic material such as aluminum. End caps 34 and 36 are threadedly connected to the shell 32 at its opposite axial ends, respectively. The elongated stress bolt 38 extends along a central rotational axis 40 of magnetodistortive rod 24 and has a head portion 42 at one axial end abutting the end cap 34. A steel mounting plate 44 is threadedly mounted on the stress bolt 38 so as to be axially positioned adjacent to its head portion 42, from which it is spaced by a washer 46. The permanent magnet 28 is rotationally anchored at one axial end to the mounting plate 44 with which the rod 24 is in abutment at one axial end. The other axial end of the rod 24 is rotationally fixed to a steel drive plate 48 through which angular movement of rod 24, resulting from torque produced by its contraction is transferred to the stroke multiplier 14 while its axial movement is blocked.

The stroke multiplier 14 as shown in FIG. 2 includes a one-piece member having circular disc portion 50 made of a suitable material to which an end portion 52 of bolt 38 is axially fixed between lock nuts 54 and 56. Flexurally elastic portions 58 axially extending from the periphery of disc portion 50 connect it to a lever disc portion 60 and a driven plate portion 62. The portions 50, 60 and 62 thereby form a lever assembly that has a fulcrum axis 64 radially spaced from the rotational axis 40 of bolt 38. The lever disc 60 is connected by a pair of coupler elements 66 extending through slots 68 in the disc 50 to a second lever disc 68. The lever disc 60 is provided with a pair of drive pins 70 projecting axially therefrom into slots formed in the drive plate 48 of the actuator 12. Similarly, the other lever disc 68 is provided with a pair of drive pins 72 projecting axially therefrom into slots formed in the driven plate 62. Each pair of drive pins 70 and 72 are equally spaced from the fulcrum axis 64 of the stroke multiplier 14 established without use of pivot pins. The driven plate 62 is in abutment with one axial end of a threaded shaft 74 projecting through a control bearing 76 in end cap 36 along the axis 40. Axial separation between the driven plate 62 and the shaft 74 is yieldably resisted by a spring 78 interconnected between the plate 62 and a nut 80 threadedly positioned on the shaft 74 in axially spaced relation to the plate 62 as shown in FIG. 2.

It will be apparent from the foregoing description of the actuator 12 and stroke multiplier 14, that axial displacing force in one direction along axis 40 under the bias of spring 78 is transmitted during one cycle of the actuator 12 through its end cap 34 to threaded connecting shaft 84 as the rod 24 is axially contracted, in view of the abutment of the bolt head 6 with the end cap 34. When the rod 24 is axially elongated at the end of such cycle, the bolt 38 transfers axially displacement of the stroke multiplier 14 through its disc 50 to the shaft 74 in abutment with driven plate 62.

During the foregoing referred to axial deformation of the magnetostrictive rod 24, its angular deformation transmits torque to drive plate 48 from which it is transferred through pins 70 to the lever disc 60 of the stroke multiplier 14 about its fulcrum axis 64 offset from the axis 40 of bolt 38. Such torque applied to disc 60 is also transferred by coupler elements 66 to lever disc 68. Because of the radial spacing between the axes 40 and 64, the torque applied to lever disc 60 is transmitted through flexure elements 58 to the disc 50 with a mechanical advantage. The torque transferred to lever disc 68 on the other hand is also transmitted through pins 72, driven plate 62 and elements 58 to disc 50 with a further increased mechanical advantage about axis 40. The torque so applied to disc 50 causes it to be angularly displaced relative to the bolt 38 on which it is threadedly mounted to cause further axial advancement of the driven plate 62 to thereby multiply the axial stroke of bolt 38 transferred to plate 62. The resulting stroke multiplied axial reciprocation of the shafts 74 and 84 is cyclically effected by intermittent energization of the actuator coil 26 as reflected by the power pulses 82 graphically depicted in FIG. 5.

The driven shafts 74 and 84, respectively extending axially from the stroke multiplier 14 and actuator 12 as hereinbefore described in connection with FIG. 1, are respectively connected to the one-way lock assemblies 16 and 18. Each lock assembly 16 and 18 is similar in construction and operation so as to block axial displacement of their shafts 74 and 84 in one direction or the other for selectively reversible motor operation. Toward that end, the entire motor system 10 is disposed between fixed parallel-spaced tracks 86 and 88 of a stationary guide structure as shown in FIG. 2 with respect to lock assembly 18. The lock assemblies 16 and 18 are engageable with such tracks for one-way brake operation.

As shown in FIGS. 2, 3 and 4, the lock assembly 18 includes an inner member 90 threadedly attached to shaft 84 and having four external ramp surfaces 92, 94, 96 and 98 respectively engaging four conical rollers 100, 102, 104 and 106. The rollers are rotatably carried by a support plate 108 having a solenoid core 110 projecting therefrom into a cavity 112 formed in member 90 as more clearly seen in FIG. 3. A solenoid coil 114 is positioned about core 110 within cavity 112 as shown for axial displacement of the rollers against the bias of spring 116 when the coil 114 is energized. When the solenoid coil 114 of the lock assembly 18 is deenergized, the spring 116 will bias the rollers into engagement with the tracks 86 and 88 and ramp surfaces 92, 94, 96 and 98 on member 90 for a one-way braking action to lock the motor system against axial displacement in one direction. The other lock assembly 16 is designed to prevent axial displacement in the other axial direction in a similar fashion. The motor system is thereby locked in both axial directions when the respective solenoid coils of the lock assemblies 16 and 18 are deenergized.

FIG. 5 graphically illustrates operational cycles during which the coil 26 of actuator 12 is intermittently energized by power pulses 82 overlapping the lock disengaging power pulses 118 and 120 applied to lock assemblies 16 and 18. As shown, the actuator pulses 82 overlap only one of the lock disengaging pulses 120 during cycle drive phases 122 and 124 under control of the analog logic 22 so as to effect motor operation in one direction during such cyclic phases. Between such phases 122 and 124, the actuator 12 remains initially energized during phases 126 and 128 to continue axial movement while both lock assemblies 16 and 18 are disengaged by simultaneous energization of both of their solenoid coils 114 for stroke extension purposes. During the cycle phases 130 and 132 preceding the drive phases 122 and 124, both lock assemblies 16 and 18 are engaged so that magnetostrictively induced distortion is limited to transfer of torsional stress through driven plate 48 to the stroke multiplier 14 as hereinbefore described to effect a subsequent increase in the axial stroke. Accordingly, the motor system will be effective to intermittently effect axial displacement of driven shaft 74 in one selected direction through a substantially increased stroke distance.

Obviously, other modifications and variations of the present invention may be possible in light of the foregoing teachings. It is therefore to be understood that within the scope of the appended claims the invention may be practiced otherwise than as specifically described.

What is claimed is:

1. A magnetostrictive motor comprising an active component having magnetodistortive material, permanent magnet means for applying a magnetic bias to said active component, electromagnetic means for subjecting said active component to a magnetic field opposing the magnetic bias with attendant movement of the active component, support means operatively connected to the active component for guiding said movement thereof, lock means mounted by the support means for locking the active component against said movement thereof in opposite directions and logic controlled means controllably energizing the electromagnetic means and the lock means for respectively generating said magnetic field and directionally disengaging the lock means in a selected one of said opposite directions to effect unidirectional displacement of the active component.

2. A magnetostrictive motor comprising an active component having magnetodistortive material, permanent magnet means for applying a magnetic bias to said active component, electromagnetic means for subjecting said active component to a magnetic field opposing the magnetic bias with attendant movement of the active component, support means operatively connected to the active component for guiding said movement thereof, lock means mounted by the support means for locking the active component against said movement thereof in opposite directions, logic controlled means controllably energizing the electromagnetic means and the lock means for respectively generating said magnetic field and directionally disengaging the lock means to effect unidirectional displacement of the active component, and stroke multiplying means rendered operative during establishment of the magnetic field by the logic controlled means in overlapping relation to engagement of the lock means simultaneously in the opposite directions for subsequently increasing said unidirectional displacement of the active component.

3. The combination of claim 2 wherein said lock means includes a stationary guide track, two one-way brake devices mounted on the support means for engagement with the guide track and solenoid operated means connected to the logic controlled means for selectively disengaging the one-way brake devices.

4. The combination of claim 1 wherein said lock means includes a stationary guide track, two one-way brake devices mounted on the support means for engagement with the guide track and solenoid operated means connected to the logic controlled means for selectively disengaging the one-way brake devices.

5. A magnetostrictive motor comprising an active component having magnetodistortive material, permanent magnet means for applying a magnetic bias to said active component, electromagnetic means for subjecting said active component to a magnetic field opposing the magnetic bias with attendant movement of the active component, support means operatively connected to the active component for guiding said movement thereof, lock means mounted by the support means for locking the active component against said movement thereof in opposite directions and stroke multiplying means responsive to generation of the magnetic field during engagement of the lock means simultaneously in the opposite directions for subsequently increasing unidirectional displacement of the active component.

6. The combination of claim 5 wherein said lock means includes a stationary guide track, two one-way brake devices mounted on the support means for engagement with the guide track and solenoid operated means connected to the logic controlled means for selectively disengaging the one-way brake devices.

7. A magnetostrictive motor comprising a stationary guide track, an active component having magnetodistortive material, permanent magnet means for applying a magnetic bias to said active component, electromagnetic means for subjecting said active component to a magnetic field opposing the magnetic bias with attendant movement of the active component, lock means operatively connected to the active component for preventing movement thereof in opposite directions relative to the guide track and logic controlled means controllably energizing the electromagnetic means and the lock means for respectively generating said magnetic field and directionally disengaging the lock means in a selected one of said opposite directions to effect unidirectional displacement of the active component.

8. A magnetostrictive motor comprising a stationary guide track, an active component having magnetodistortive material, permanent magnet means for applying a magnetic bias to said active component, electromagnetic means for subjecting said active component to a magnetic field opposing the magnetic bias with attendant movement of the active component, lock means operatively connected to the active component for preventing movement thereof in opposite directions relative to the guide track, logic controlled means controllably energizing the electromagnetic means and the lock means for respectively generating said magnetic field and directionally disengaging the lock means to effect unidirectional displacement of the active component, and stroke multiplying means rendered operative during establishment of the magnetic field by the logic controlled means in overlapping relation to engagement of the lock means simultaneously in the opposite directions for subsequently increasing said unidirectional displacement of the active component.

9. The combination of claim 7 wherein said lock includes two one-way brake devices for engagement with the guide track and solenoid operated means connected to the logic controlled means for selectively disengaging the one-way brake devices.

10. In a motor system having an actuator adapted to be magnetostrictively elongated by a predetermined amount in response to energization of an excitation coil, the improvement residing in: permanent magnet means applying a magnetic bias to said actuator for reducing elongation thereof by said predetermined amount and analog logic means for controlling said energization of the coil.

11. In the motor system as defined in claim 10, driven means operatively connected to the actuator for linear displacement, and one-way brake means controlled by said analog logic means for unidirectionally limiting said linear displacement of the driven means by the actuator.

12. In the motor system as defined in claim 11, stroke multiplier means operatively connected to the actuator for multiplying said linear displacement of the driven means in response to angular deformation of the actuator.

13. In a motor system having an actuator adapted to be magnetostrictively elongated by a predetermined mount in response to energization of an excitation coil, the improvement residing in: permanent magnet means applying a magnetic bias to said actuator for reducing elongation thereof by said predetermined amount, analog logic means for controlling said energization of the coil, driven means operatively connected to the actuator for linear displacement, one-way brake means controlled by said analog logic means for unidirectionally limiting said linear displacement of the driven means by the actuator, and stroke multiplier means operatively connected to the actuator for multiplying said linear displacement of the driven means in response to angular deformation of the actuator, said stroke multiplier means including a one-piece flexible lever assembly and means mounting said lever assembly for angular displacement about a pivotal axis offset from the actuator in response to said angular deformation thereof.

14. In the motor system as defined in claim 10, stroke multiplier means operatively connected to the actuator for multiplying said linear displacement of the driven means in response to angular deformation of the actuator.

15. In a motor system having an actuator adapted to be magnetostrictively elongated by a predetermined mount in response to energization of an excitation coil, the improvement residing in: permanent magnet means applying a magnetic bias to said actuator for reducing elongation thereof by said predetermined mount, driven means operatively connected to the actuator for linear displacement in response to angular deformation of the actuator, analog logic means controlling said energization of the coil for limiting said linear displacement of the driven means by the actuator, and stroke multiplier means operatively connected to the actuator for multiplying said linear displacement of the driven means including a one-piece flexible lever assembly and means mounting said lever assembly for angular displacement about a pivotal axis offset from the actuator in response to said angular deformation thereof.

16. In a motor system having an actuator adapted to be magnetostrictively elongated by a predetermined amount in response to energization of an excitation coil and driven means operatively connected to the actuator for linear displacement, the improvement residing in: stroke multiplier means operatively connected to the actuator for multiplying said linear displacement of the driven means in response to angular deformation of the actuator, said stroke multiplier means including a one-piece flexible lever assembly and means mounting said lever assembly for angular displacement about a pivotal axis offset from the actuator in response to said angular deformation thereof.

17. In a motor system having an actuator undergoing angular deformation in response to energization of an excitation coil and driven means operatively connected to the actuator for linear displacement, the improvement residing in selectively energized lock means for cyclic engagement with the actuator to prevent said linear displacement thereof; logic controlled means for effecting said energization of the excitation coil in overlapping relation to said cyclic engagement of the lock means; and stroke multiplier means for increasing said linear displacement of the driven means by the actuator during disengagement of the lock means between said cyclic engagement thereof.

18. The improvement as defined in claim 17 wherein said stroke multiplier means includes a lever assembly operatively connecting the actuator to the driven means and means mounting the lever assembly for angular displacement in pivotal offset relation to the actuator during said angular deformation thereof.

* * * * *